United States Patent
Kim et al.

(10) Patent No.: US 7,061,184 B2
(45) Date of Patent: Jun. 13, 2006

(54) PLASMA ELECTRON DENSITY MEASURING AND MONITORING DEVICE

(75) Inventors: Jung Hyung Kim, Daejon (KR); Yong Hyeon Shin, Daejon (KR); Kwang Hwa Chung, Daejon (KR); Sang Cheol Choi, Daejon (KR)

(73) Assignee: Korea Research Institute of Standards of Science, Daejeon (KR)

( * ) Notice: Subject to any disclaimer, the term of this patent is extended or adjusted under 35 U.S.C. 154(b) by 0 days.

(21) Appl. No.: 10/896,156

(22) Filed: Jul. 21, 2004

(65) Prior Publication Data

US 2005/0016683 A1    Jan. 27, 2005

(30) Foreign Application Priority Data

Jul. 23, 2003    (KR) .................. 10-2003-0050408

(51) Int. Cl.
*H01J 7/24*    (2006.01)
(52) U.S. Cl. .................. 315/111.71; 315/111.21; 324/639
(58) Field of Classification Search .......... 315/111.21, 315/111.71, 111.81, 111.91; 324/639, 629; 118/723 I, 723 IR
See application file for complete search history.

(56) References Cited

U.S. PATENT DOCUMENTS 6,455,437 B1 * 9/2002 Davidow et al. .......... 438/710
6,573,731 B1 * 6/2003 Verdeyen et al. .......... 324/639
6,744,211 B1 * 6/2004 Sugai et al. ............ 315/111.21

OTHER PUBLICATIONS

Shirakawa, Teruyuki, et al., "Plasma Oscillation Method for Measurements of Absolute Electron Density in Plasma", Jpn. J. Appl. Phys., vol. 32, 1993, pp. 5129-5135.
Kokura, Hikaru, et al., "Plasma Absorption Probe for Measuring Electron Density in an Environment Soiled with Processing Plasmas", Jpn. J. Appl. Phys., vol. 38, 1999, pp. 5262-5266.

* cited by examiner

*Primary Examiner*—Wilson Lee
*Assistant Examiner*—Jimmy Vu
(74) *Attorney, Agent, or Firm*—McCarter & English, LLP

(57) ABSTRACT

The present invention discloses a device for measuring and monitoring electron density of plasma. The device includes a chamber filled with plasma having varying electron density; a frequency probe having transmission/receiving antennas and a pair of waveguides, one end of which is mounted in the chamber, for radiating and receiving electromagnetic waves; an electromagnetic wave generator electrically connected to one of the waveguides of the frequency probe for generating electromagnetic waves; and a frequency analyzer for scanning the frequency of received electromagnetic waves and analyzing the scanned frequency with respect to the amplitude of the received electromagnetic waves. Coupled to the rear end of the frequency probe is preferably a transfer unit having a hydraulic cylinder structure such that the frequency probe is moved in the chamber to detect the spatial distribution of electron density.

11 Claims, 5 Drawing Sheets

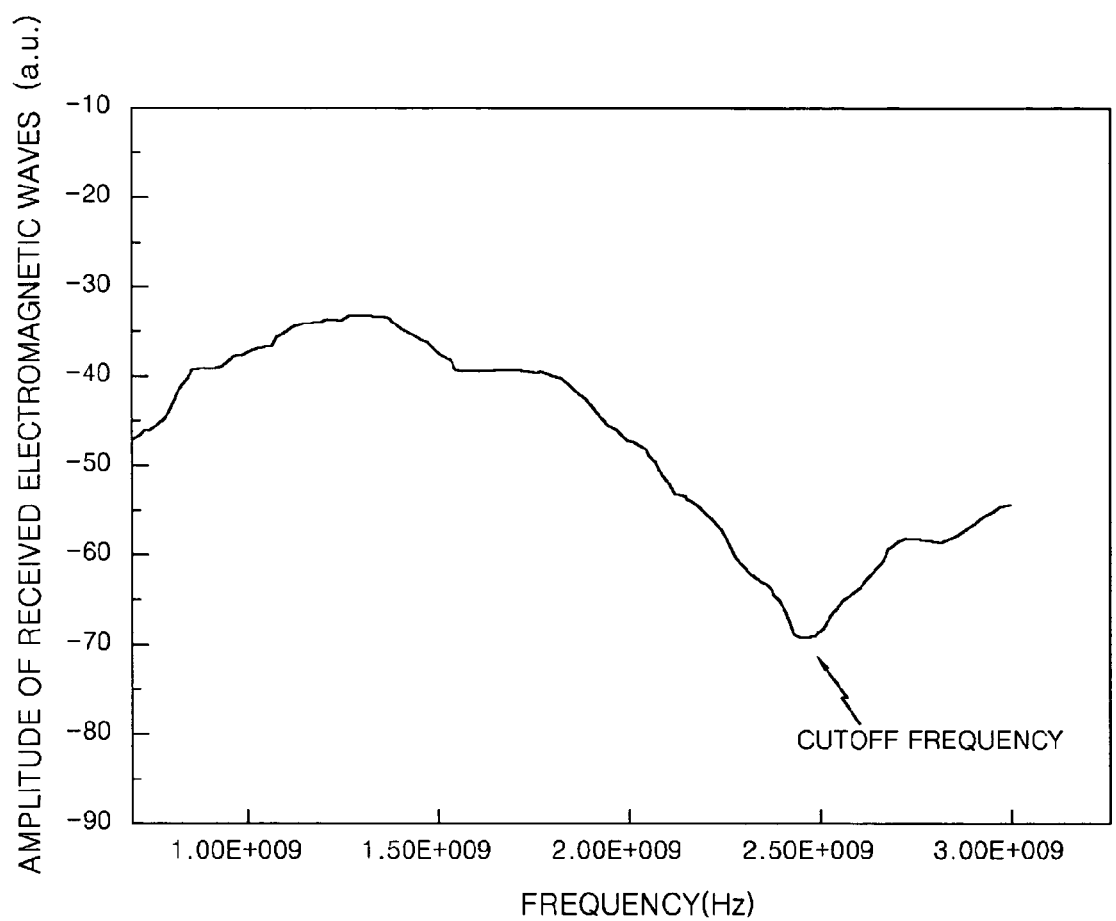

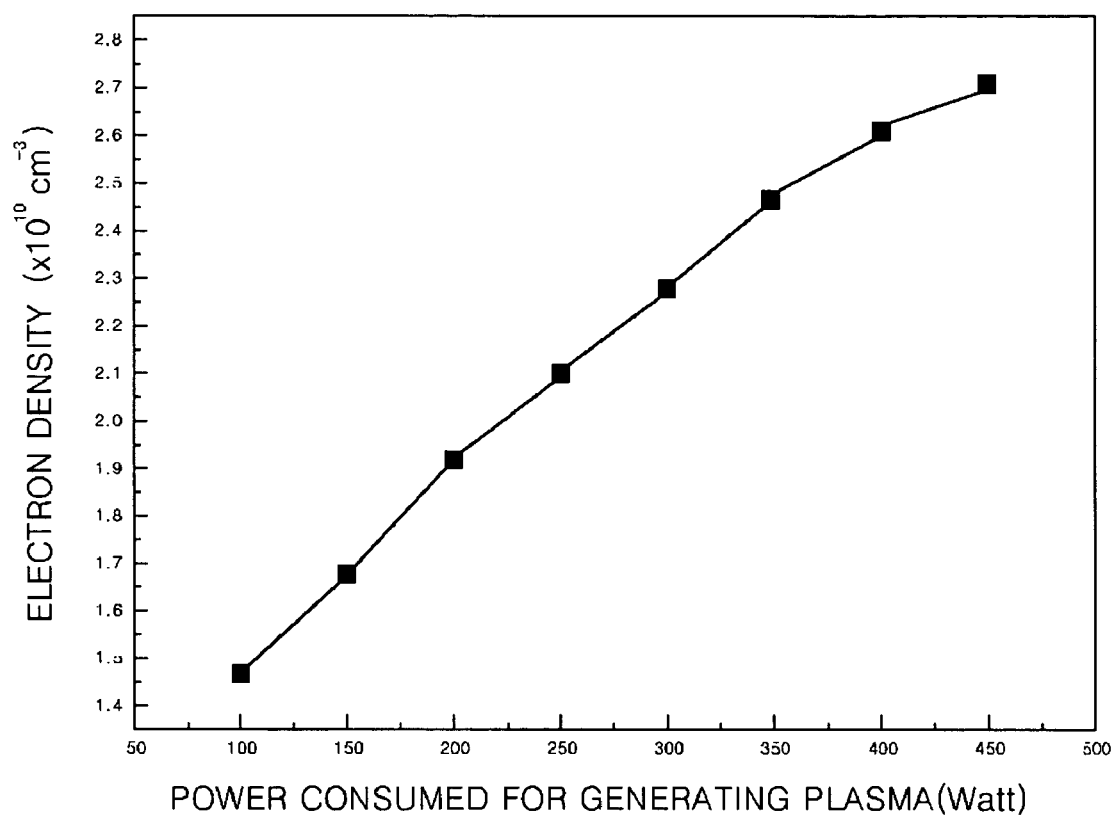

PLASMA ELECTRON DENSITY MEASURING AND MONITORING DEVICE

BACKGROUND OF THE INVENTION

1. Field of the Invention

The present invention relates to a technique of scanning a frequency band that is cut off when an electromagnetic wave corresponding to the natural frequency of plasma is applied to the plasma in order to use a correlation between the density and the natural frequency of plasma, to measure and monitor the plasma density. Specifically, the present invention relates to a device for measuring and monitoring electron density of plasma, that includes a frequency probe having an antenna structure for scanning plasma while applying electromagnetic waves to the plasma and an analyzer for analyzing a frequency band that is cut off when an electromagnetic wave corresponding to the natural frequency of the plasma is applied to the plasma.

2. Background of the Related Art

Plasma is widely used for manufacturing semiconductor devices because it is required that the semiconductor devices be miniaturized and semiconductor processes be performed at low temperature required. Equipment used for manufacturing semiconductor devices includes an ion implantation apparatus used for implanting desired impurity into a predetermined region of a wafer, a furnace used for growing a thermal oxide film layer, a deposition apparatus used for depositing a conductive layer or an insulating layer on a wafer, and exposure and etching apparatuses used for patterning the deposited conductive layer or insulating layer into a desired shape.

Plasma equipment, which forms plasma in a vacuumed airtight chamber and injects reaction gases into the chamber to deposit a material layer or etch a deposited layer, is widely used as an apparatus for depositing a predetermined layer on a wafer or etching a predetermined layer formed on the wafer. The reason for this is that a material layer can be deposited using plasma at low temperature such that impurities in impurity regions formed in the wafer are not diffused and uniform thickness of the material layer can be obtained even when the material layer is formed on a large-size wafer.

Furthermore, when a predetermined film formed on the wafer is etched using plasma, uniform etch rate over the entire wafer can be obtained.

Langmuir probe is widely used as a device for measuring electron density and ion density of plasma of the plasma equipment. The principle of the Langmuir probe is follows: A probe is inserted into a plasma chamber filled with plasma and varies a DC voltage applied to the probe within a range of −200V to 200V to measure characteristic of the plasma. Here, positive ions in the plasma are collected in the probe when a negative voltage is applied to the end of the probe to generate current based on the ions. When a positive voltage is applied to the end of the probe, electrons in the plasma are collected in the probe to generate current based on the electrons. Then, the plasma density is obtained by measuring the generated current and analyzing a correlation between the current and the voltage applied to the probe.

The conventional Langmuir probe can measure plasma density in real time because it inserts the probe into the chamber to measure the plasma density. However, the conventional Langmuir probe is difficult to use for the actual mass production because noises are generated due to RF oscillation, a thin film material is deposited on the probe when a process of depositing the thin film material is performed to fabricate a semiconductor device, and the probe is etched when dry etch is carried out.

In the meantime, a plasma oscillation probe and a plasma absorption probe have been developed as a tool for monitoring a plasma process. However, these devices cannot be appropriately utilized for the actual mass production.

A conventional plasma oscillation probe uses a hot wire to generate an electron beam. The hot wire is cut at high pressure of higher than 50 mT and thus operating conditions of the plasma oscillation probe are narrowly restricted. Furthermore, when the hot wire is heated in order to emit hot electrons, the hot wire is evaporated to contaminate a reaction chamber.

For a conventional plasma absorption probe, there occurs a problem in that it should be calibrated using an accurate plasma density test tool before being operated. Although there has been proposed an improved probe structure, it requires a number of calculation steps for calculating the absolute value of a measured density. Here, physically assumed conditions are included in the calculation steps so that effectiveness of the measurement of the plasma density is decreased.

SUMMARY OF THE INVENTION

Accordingly, the present invention has been made in view of the problems occurring in the prior art, and it is an object of the present invention is to provide a device for measuring and monitoring electron density of plasma, which includes a frequency probe having an antenna structure, which analyzes the frequency of plasma based on electron density using an electromagnetic wave transmitting/receiving structure to measure and monitor plasma electron density.

Another object of the present invention is to provide a device for measuring and monitoring electron density of plasma, which moves the frequency probe in a plasma chamber to measure and monitor the spatial distribution of electron density.

To accomplish the above objects, according to the present invention, there is provided a device for measuring and monitoring electron density of plasma, the device including a chamber 100 filled with plasma having varying electron density; an electromagnetic wave transmitting/receiving means having an antenna structure, one end of which is mounted in the chamber 100, such that the density of the plasma and the frequency of radiated electromagnetic waves have a correlation between them; an electromagnetic wave generator 300 electrically connected to the electromagnetic wave transmitting/receiving means, for continuously radiating electromagnetic waves by frequency bands to the electromagnetic wave transmitting/receiving means; a frequency analyzer 400 electrically connected to the electromagnetic wave transmitting/receiving means, for scanning the frequency of electromagnetic waves received by the electromagnetic wave transmitting/receiving means and analyzing the scanned frequency by amplitudes of the received electromagnetic waves; and a computer 600 connected to the electromagnetic wave generator 300 and the frequency analyzer 400 via an interface unit 610, for instructing the electromagnetic wave generator to transmit the electromagnetic waves by frequency bands and obtaining a correlation between the frequency and the electron density of the analyzed electromagnetic wave through operation.

Preferably, the electromagnetic wave transmitting/receiving means is a frequency probe 200 including a first waveguide 210 electrically connected to the electromagnetic wave generator 300, a second waveguide 220 located in parallel with the first waveguide 210 and electrically connected to the frequency analyzer 400, a transmission antenna 210a coaxially connected to one end of the first waveguide for radiating electromagnetic waves, and a receiving antenna 220a coaxially connected to one end of the second waveguide 220 for receiving electromagnetic waves.

Preferably, the plasma electron density measuring and monitoring device further includes a transfer unit 500 connected to the other end of the electromagnetic wave transmitting/receiving means, opposite to one end thereof located in the chamber, such that the frequency probe is moved in the chamber 100. The transfer unit 500 includes a movable rod 510a coaxially connected to the other end of the frequency probe 200 for allowing the frequency probe to be moved in the chamber 100; a drive means 510 coupled with the movable rod 510a for forcing the movable rod to move; and a driving force supply 520 connected to the drive means 510 through a pipe for supplying a driving force to the drive means 510 in cooperation with the frequency analyzer 400, the driving force supply having a power supply circuit connected to the computer 600 via the interface unit 610.

Preferably, the frequency probe 200 further includes a single dielectric tube 230 for covering the first and second waveguides 210 and 220.

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 4 is a graph showing the relationship between the frequency and the amplitude of received electromagnetic waves, analyzed by a monitoring device according to the present invention; and FIG. 5 is a graph showing the relationship between the electron density and power consumed for generating plasma, measured by the monitoring device according to the present invention.

DETAILED DESCRIPTION OF THE PREFERRED EMBODIMENT

Reference will now be made in detail to the preferred embodiments of the present invention, examples of which are illustrated in the accompanying drawings.

Figure 1:
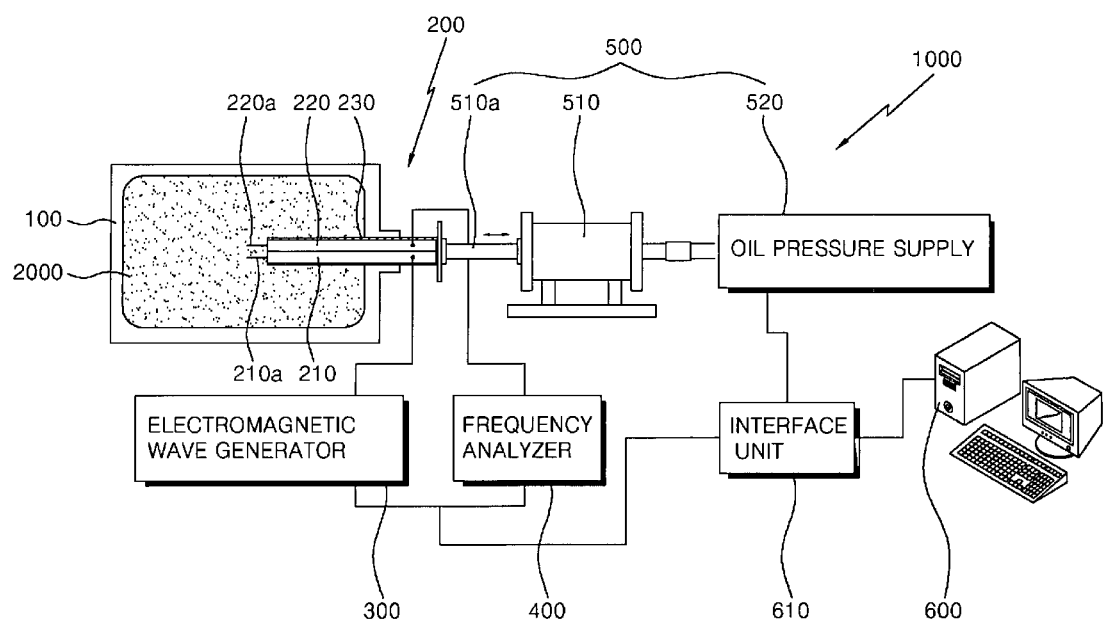
FIG. 1 illustrates a plasma electron density measuring and monitoring device according to the present invention.

FIG. 1 illustrates a plasma electron density measuring and monitoring device 1000 according to the present invention. Referring to FIG. 1, the measuring and monitoring device 1000 uses a frequency probe 200 as an electromagnetic wave transmitting/receiving means for analyzing the natural frequency of plasma 2000 for varying plasma electron density and monitoring the natural frequency in real time. When an electromagnetic wave is applied to the plasma, the frequency of electromagnetic wave that does not transmit the plasma 2000 is the cutoff frequency of the plasma. The cutoff frequency is the natural frequency of the plasma 2000, which is an index of electron density of the plasma 2000.

Accordingly, the present invention uses the frequency probe 200 as a means for transmitting/receiving electromagnetic waves to search a cutoff frequency so as to measure and monitor the electron density using a correlation between the electron density and the cutoff frequency. The frequency probe 200 has an antenna structure in order to transmit and receive electromagnetic waves.

The plasma electron density measuring and monitoring device 1000 of the present invention includes a chamber 100 filled with the plasma 2000, the frequency probe 200 mounted at one side of the chamber 100 to transmit/receive electromagnetic waves, an electromagnetic wave generator 300 electrically connected to the frequency probe 200 to transmit electromagnetic waves, and a frequency analyzer 400 for analyzing the electromagnetic waves received from the frequency probe 200 by frequencies. The measuring and monitoring device 1000 further includes a transfer unit 500 connected to the frequency probe 200. The transfer unit 500 transfers the frequency probe 200 inside the chamber 100 to transmit/receive electromagnetic waves to detect the spatial distribution of electron density.

The plasma electron density in the chamber 100 is continuously varied based on semiconductor processes. The frequency probe 200 is set in the chamber 100 and measures the electron density.

The frequency probe 200 includes first and second waveguides 210 and 220, a rod type transmission antenna 210a and receiving antenna 220a respectively connected to the first and second waveguides 210 and 220. The transmission antenna 210a transmits electromagnetic waves and the receiving antenna 220a receives the electromagnetic waves.

The antennas 210a and 220a are coaxially connected to cut portions of the first and second waveguides 210 and 220, respectively. The transmission antenna 210a is connected to the first waveguide 210 to which electromagnetic generator 300 is connected and radiates electromagnetic waves. The receiving antenna 220a is connected to the second waveguide 220 to which the frequency analyzer 400 is connected.

The electromagnetic wave generator 300 is electrically connected to the first waveguide 210 and generates electromagnetic waves. The transmission antenna 210a connected to the first waveguide 210 radiates the electromagnetic waves, transmitted from the electromagnetic wave generator 300, to the plasma 2000 in the chamber 100. The electromagnetic wave generator 300 according to the present invention generates electromagnetic waves of frequency bands of approximately 5 MHz through 100 GHz in consideration of electron density of the plasma 2000 used for semiconductor processes.

The second waveguide 200 is electrically connected to the frequency analyzer 400 and coupled to the receiving antenna 220a. When the transmission antenna 210a radiates electromagnetic waves to the plasma 2000, the receiving antenna 220a receives the electromagnetic waves. The received electromagnetic waves are transmitted to the frequency analyzer 400 through the second waveguide 220. The frequency analyzer 400 analyzes the amplitude of the received electromagnetic waves by frequency bands. FIG. 4 is a graph showing the analyzed amplitude with respect to the frequency bands. Referring to FIG. 4, the cutoff frequency, that is, the frequency corresponding to plasma electron density, has a remarkably reduced level and the smallest amplitude. Thus, the electron density can be obtained from the cutoff frequency.

The electromagnetic wave generator 300 and the frequency analyzer 400 are connected to a computer 600 via an interface unit 610. A program concerning a formula that defines a correlation between the plasma electron density and the analyzed electromagnetic wave frequency is installed in the computer 600. The computer 600 converts the analyzed frequency into electron density using the formula. In addition, the computer 600 instructs the electromagnetic wave generator 300 to transmit electromagnetic waves to the first waveguide 210.

The transfer unit 500 is connected to one end of the frequency probe 200, which is opposite to the end located in the chamber 100, such that the frequency probe 200 can be moved in the axial line direction. The transfer unit 500 uses oil pressure. The transfer unit 500 includes a movable rod 510a coaxially connected to the end of the frequency probe 200, a hydraulic cylinder 510 into which the movable rod 510a is inserted, and an oil pressure supply 520 connected to the hydraulic cylinder 510 through a pipe to supply oil pressure to the hydraulic cylinder 510. The hydraulic cylinder 510 forces the movable rod 510a to move with oil pressure.

A power supply circuit of the oil pressure supply 520 is connected to the computer 600 via the interface unit 610 to be instructed by the computer 600. The transfer unit 500 is used to move the frequency probe 200 inside the chamber 100 to detect the spatial distribution of plasma electron density.

The electron density of the plasma 2000 filled in the chamber 100 is varied based on semiconductor processes. To measure the varying electron density, the transmission antenna 210a radiates an electromagnetic wave while changing its frequency band and the receiving antenna 220a receives the radiated electromagnetic wave.

Furthermore, the plasma 2000 has different electron densities according to positions in the chamber 100. Thus, the transfer unit 500 is used to measure and monitor the spatial distribution of electron density. The oil pressure supply 520 of the transfer unit 500 includes the power supply circuit connected to the computer 600. Accordingly, the movable rod 510a is operated based on an operation code programmed in the computer 600.

Moreover, the measuring and monitoring device according to the present invention can perform an operation of measuring and monitoring electron density by time and an operation of measuring and monitoring electron density by positions, alternately or in parallel. The alternate operations or parallel operations are decided by a program installed in the computer 600.

Figure 2:
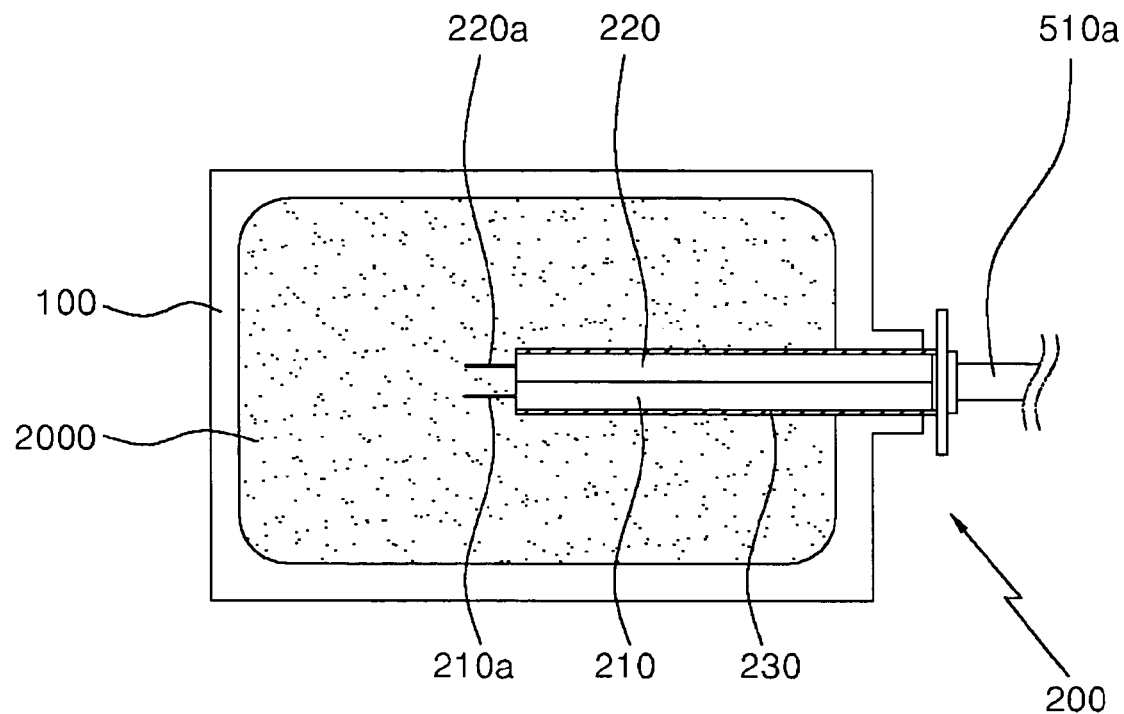
FIG. 2 illustrates the combined structure of a frequency probe and a chamber according to the present invention.

FIG. 2 illustrates the combined structure of the frequency probe 200 and the chamber 100. Referring to FIG. 2, one side of the frequency probe 200 is mounted in the chamber through the side of the chamber 100. The chamber 100 is filled with the plasma 2000 having varying electron density. The side of the chamber 100, through which the frequency probe 200 is inserted into the chamber 100, has a guide structure for guiding the frequency probe 200 to move straight in the axial line direction.

The frequency probe 200 has the antenna structure consisting of the transmission antenna 210a radiating electromagnetic waves, the first waveguide 210, the receiving antenna 220a receiving the electromagnetic waves and the second waveguide 220. According to this structure, plasma electron density and frequency corresponding thereto have a correlation between them.

The first and second waveguides 210 and 220 are arranged in parallel with each other, and the transmission antenna 210a and receiving antenna 220a are also located in parallel with each other. The transmission and receiving antennas 210a and 220a have a distance of approximately 1 mm to 5 mm between them and each of the antennas has a length of approximately 5 mm to 10 mm, for instance. The shorter the distance between the antennas is, the better it is. The length of each of the antennas depends on the wavelength of electromagnetic waves.

The first and second waveguides 210 and 220 of the frequency probe 200 are covered with a single dielectric tube 230, respectively. The dielectric tube 230 is made of alumina or crystal and protects the first and second waveguides 210 and 220 from high-temperature plasma 2000. In addition, the dielectric tube 230 prevents the portions of the waveguides 210 and 220, other than the ends of the waveguides at which the antennas 210a and 220a are located, from being affected by noises and heat. While the two waveguides 210 and 220 are arranged in parallel with each other, a single dielectric tube 230 is used.

Figure 3:
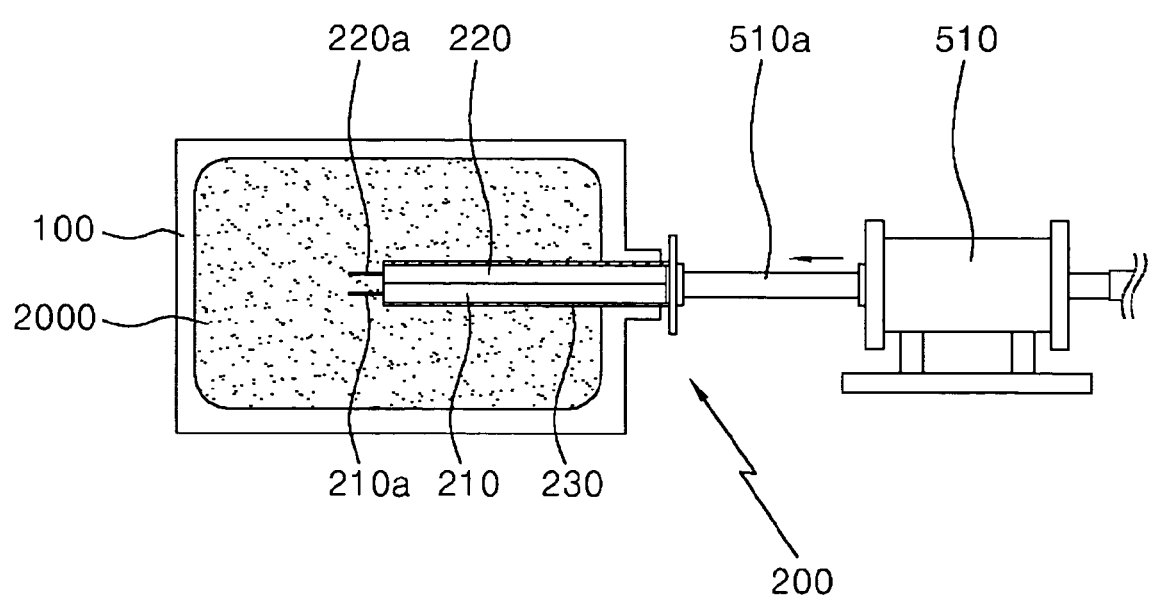
FIG. 3 illustrates the operating state of the frequency probe according to the present invention.

FIG. 3 illustrates the operating state of the frequency probe 200 according to the present invention. Referring to FIG. 3, the other end of the frequency probe 200 is connected to the transfer unit 500. The transfer unit 500 includes the movable rod 510a, hydraulic cylinder 510 that pushes or pulls the movable rod 510a inserted therein using oil pressure, and oil pressure supply 520 providing oil pressure to the hydraulic cylinder 510.

The power supply circuit of the oil pressure supply 520 is connected to the computer 600 via the interface unit 610. Accordingly, the computer 600 can instruct the oil pressure supply 520 to supply oil pressure to the hydraulic cylinder 510 and transfer the frequency probe 200 using the movable rod 510a. The frequency probe 200 is guided by the guide structure formed at the side of the chamber 100 to be moved in the axial line direction.

As described above, the plasma electron density measuring and monitoring device of the present invention has the structure of moving the frequency probe and transmitting/receiving electromagnetic waves. The measuring and monitoring device measures the cutoff frequency while varying frequency intensity from the lowest level to the highest level at a specific point inside the chamber 100 and moves the frequency probe to the next point to measure the cutoff frequency. In this manner, the spatial distribution of plasma electron density can be detected.

FIG. 4 is a graph showing the frequency analyzed by the measuring and monitoring device 1000 according to the present invention. In FIG. 4, X-axis is the frequency band (Hz) and Y-axis is the amplitude (a.u.) of electromagnetic wave received through the receiving antenna 220a. Referring to FIG. 4, the amplitude of electromagnetic wave is increased as the frequency is increased and then decreased at the frequency of approximately $1.5 \times 10^9$ Hz. The amplitude of electromagnetic wave becomes minimum when the frequency is approximately $2.5 \times 10^9$ Hz. The frequency at which the amplitude has the minimum value is the cutoff frequency.

As described above, the cutoff frequency means the frequency of electromagnetic wave that cannot transmit the plasma 2000 when the transmission antenna 210a radiates electromagnetic waves to the plasma. Accordingly, the receiving antenna 220a cannot receive the cutoff frequency or receives only a very weak signal. The cutoff frequency is used as an index of detecting plasma electron density.

In the present invention, the electromagnetic wave generator 300 generates electromagnetic waves, which are continuously transmitted to the transmission antenna 210a through the first waveguide 210 to be radiated to the plasma 2000. The receiving antenna 220a continuously receives the radiated electromagnetic waves. The electromagnetic waves received by the receiving antenna 220a are transmitted to the frequency analyzer 400 to be scanned by frequency bands. Data obtained by scanning the electromagnetic waves is sent to the computer 600 and displayed as the graph of FIG. 4. After the scanning is finished, the frequency band corresponding to the lowest amplitude becomes the cutoff frequency.

FIG. 5 is a graph showing electron density measured using the monitoring device 1000 according to the present invention. In FIG. 5, X-axis represents power consumed for generating plasma, required for accelerating ions of the plasma, in the range of approximately 50 Watt to 500 Watt. Y-axis is plasma electron density in the range of approximately 100 Watt to 500 Watt. As the consumed power is increased, ionization is accelerated and thus plasma electron density is increased.

The power consumed for generating plasma is a factor of increasing the plasma electron density and thus the plasma electron density in the chamber is continuously varied.

The electromagnetic wave generator 300 sets a predetermined frequency bandwidth and generates electromagnetic waves by frequency intensities within the set frequency bandwidth. The electromagnetic waves generated by the electromagnetic wave generator 300 are radiated through the transmission antenna 210a such that the cutoff frequency corresponding the varying plasma electron density can be detected. The electron density is varied with time so that the electron density can be detected by time. Thus, the electron density can be monitored in real time.

The aforementioned plasma electron density measuring and monitoring device 1000 according to the present invention includes a single frequency probe 200 located at the side of the chamber 100 and connected to the transfer unit 500. However, the plasma electron density measuring and monitoring device of the present invention can include three frequency probes that are respectively vertically mounted at the top, bottom and side of the chamber 100 and connected to respective transfer units such that the frequency probes are moved in X-, Y- and Z-axes directions inside the chamber 100 to measure three-dimensional electron density spatial distribution.

Furthermore, while the frequency probe 200 is used as an electromagnetic wave transmitting/receiving means in the measuring and monitoring device 1000 according to the present invention, an antenna structure for transmitting and receiving electromagnetic waves, such as a loop antenna, super-turn style antenna, Yagi antenna, parabola antenna and so on, can be also used to measure the cutoff frequency by electron densities.

While the hydraulic cylinder 510 using oil pressure as a driving force is employed for the transfer unit 500, a structure that has a rack coupled to the frequency probe 200 and a pinion coupled to a step motor and uses a pneumatic cylinder and the step motor as a driving source can replace the hydraulic cylinder.

As described above, the plasma electron density measuring and monitoring device according to the present invention can measure plasma electron density by detecting the natural frequency of plasma for varying electron density. Accordingly, the measuring and monitoring device of the present invention can be applied to thin film plasma chemical deposition and plasma dry etching processes.

Furthermore, the plasma electron density measuring and monitoring device according to the present invention can be used as an apparatus for monitoring the plasma electron density by time. Thus, the device can be utilized as reliable processing equipment.

The forgoing embodiments are merely exemplary and are not to be construed as limiting the present invention. The present teachings can be readily applied to other types of apparatuses. The description of the present invention is intended to be illustrative, and not to limit the scope of the claims. Many alternatives, modifications, and variations will be apparent to those skilled in the art.

What is claimed is:

1. A plasma electron density measuring and monitoring device, the device comprising:
    a chamber filled with plasma having varying electron density;
    electromagnetic wave transmitting/receiving means having an antenna structure, one end of which is mounted in the chamber, such that the density of the plasma and the frequency of radiated electromagnetic waves have a correlation between them;
    an electromagnetic wave generator electrically connected to the electromagnetic wave transmitting/receiving means, for continuously radiating electromagnetic waves by frequency bands to the electromagnetic wave transmitting/receiving means;
    a frequency analyzer electrically connected to the electromagnetic wave transmitting/receiving means, for scanning the frequency of electromagnetic waves received by the electromagnetic wave transmitting/receiving means and analyzing the scanned frequency by amplitudes of the received electromagnetic waves; and
    a computer connected to the electromagnetic wave generator and the frequency analyzer via an interface unit, for instructing the electromagnetic wave generator to transmit the electromagnetic waves by frequency bands and obtaining a correlation between the frequency and the electron density of the analyzed electromagnetic wave through operation,
    wherein the electromagnetic wave transmitting/receiving means is a frequency probe comprising:
    a first waveguide electrically connected to the electromagnetic wave generator;
    a second waveguide located in parallel with the first waveguide and electrically connected to the frequency analyzer;
    a transmission antenna coaxially connected to one end of the first waveguide for radiating electromagnetic waves; and
    a receiving antenna coaxially connected to one end of the second waveguide for receiving electromagnetic waves.

2. The device as claimed in claim 1, further comprising a transfer unit connected to the other end of the electromagnetic wave transmitting/receiving means, opposite to end located in the chamber, such that the frequency probe is moved in the chamber.

3. The device as claimed in claim 2, wherein the transfer unit comprises:
    a movable rod coaxially connected to the other end of the frequency probe for allowing the frequency probe to be moved in the chamber;
    drive means coupled with the movable rod for forcing the movable rod to move; and
    a driving force supply connected to the drive means through a pipe for supplying a driving force to the drive means in cooperation with the frequency analyzer, the driving force supply having a power supply circuit connected to the computer via the interface unit.

4. The device as claimed in claim 3, wherein the drive means is a hydraulic cylinder.

5. The device as claimed in claim 3, wherein the drive means is a pneumatic cylinder.

6. The device as claimed in claim 3, wherein the drive means is a step motor, and a rack is coupled to the other end of the frequency probe and a pinion is coupled to the step motor.

7. The device as claimed in claim 1, wherein the frequency probe further comprises a single dielectric tube for covering the first and second waveguides.

8. The device as claimed in claim 1, wherein the electromagnetic wave transmitting/receiving means comprises a loop antenna for measuring a cutoff frequency that is the natural frequency of the plasma by electron density using the antenna structure.

9. The device as claimed in claim 1, wherein the electromagnetic wave transmitting/receiving means comprises a super-turn style antenna for measuring a cutoff frequency that is the natural frequency of the plasma by electron density using the antenna structure.

10. The device as claimed in claim 1, wherein the electromagnetic wave transmitting/receiving means comprises a Yagi antenna for measuring a cutoff frequency that is the natural frequency of the plasma by electron density using the antenna structure.

11. The device as claimed in claim 1, wherein the electromagnetic wave transmitting/receiving means is a parabola antenna for measuring a cutoff frequency that is the natural frequency of the plasma by electron density using the antenna structure.

* * * * *